United States Patent [19]
Ono

[11] Patent Number: 4,547,762
[45] Date of Patent: Oct. 15, 1985

[54] DIGITAL TO ANALOG CONVERTING APPARATUS

[75] Inventor: Masahiko Ono, Tokyo, Japan

[73] Assignee: Tokyo Shibaura Denki Kabushiki Kaisha, Kawasaki, Japan

[21] Appl. No.: 578,607

[22] Filed: Feb. 13, 1984

Related U.S. Application Data

[63] Continuation of Ser. No. 310,317, Oct. 9, 1981, abandoned.

[30] Foreign Application Priority Data

Nov. 13, 1980 [JP] Japan ................................ 55-159929

[51] Int. Cl.$^4$ ............................................ H03K 13/02
[52] U.S. Cl. ............................................ 340/347 DA
[58] Field of Search ................ 307/228; 340/347 DA; 318/601

[56] References Cited
U.S. PATENT DOCUMENTS

| | | | |
|---|---|---|---|
| 2,855,540 | 10/1958 | Hoover et al. | |
| 3,252,045 | 5/1966 | Griffin | 307/228 |
| 3,258,765 | 6/1966 | Battjes | 340/347 DA |
| 3,518,658 | 6/1970 | Black | 340/347 DA |
| 3,523,229 | 8/1970 | Black | 318/601 |
| 4,023,122 | 5/1977 | Oura | 307/228 |
| 4,225,825 | 9/1980 | Watts | 307/228 |

OTHER PUBLICATIONS

"ICIREPAT System 03 A-D Converters Manual", Mar. 1970, pp. 27-28.
Data Acquisition Products Catalog, 1978, by Analog Devices, Inc., pp. 271-275.

Primary Examiner—Charles D. Miller
Attorney, Agent, or Firm—Kenyon & Kenyon

[57] ABSTRACT

A digital to analog converting apparatus is disclosed, which converts an analog output voltage into a digital value and compares the digital value with a digital input value, and corrects the analog output voltage according to the result of the comparison. The apparatus includes a current source for supplying current according to the result of the comparison and a capacitor which is charged and discharged by the current from the current source. The output voltage of the capacitor is provided as the analog output voltage.

2 Claims, 5 Drawing Figures

DIGITAL TO ANALOG CONVERTING APPARATUS

This application is a continuation of application Ser. No. 310,317 filed Oct. 9, 1981, now abandoned.

BACKGROUND OF THE INVENTION

This invention relates to a digital to analog converting apparatus having an analog to digital converter (hereinafter called "A/D converter") which converts an analog output signal into a digital signal so that the digital signal may be compared with a digital input signal.

There has long been used a digital to analog (D/A) converting apparatus having a plurality of switches, a resistor ladder circuit, an A/D converter, a comparator and a switching control circuit. The switches are opened and closed under the control of the switching control circuit, whereby the resistor ladder circuit divides a power source voltage and generates an analog voltage of a desired value. The analog voltage is applied to the comparator through the A/D converter and is then compared with a digital input signal supplied to the comparator. The output of the comparator is supplied to the switching control circuit. The switching control circuit controls the switches in accordance with the output of the comparator. This sequence of operation is repeated until the two input signals to the comparator have the same value. When the input signals of the comparator are the same, that is, when the output voltage of the resistor ladder circuit is changed to equal that of the digital input signal, the D/A conversion is completed. While the above-described D/A converting apparatus responds very quickly, it requires a large amount of circuitry due to the resistor ladder circuit, and is therefore expensive.

SUMMARY OF THE INVENTION

It is an object of this invention to provide a digital to analog converting apparatus which has little circuitry and which is thus inexpensive.

This object is achieved by a digital to analog converting apparatus which comprises comparison means having first and second input terminals and generating a comparison signal representing a difference between two signals supplied to the first and second input terminals, the first input terminal being connected to receive a digital signal; a current generating circuit connected to the comparison means for generating current according to the value of the comparison signal; a capacitor connected to the current generating circuit; and an analog to digital converter connected to the capacitor and the second input terminal of the operation circuit for supplying to the second input terminal a digital signal whose value corresponds to an output voltage of the capacitor.

DETAILED DESCRIPTION OF THE PREFERRED EMBODIMENTS

Now referring to the accompanying drawings, the embodiments of the invention will be described.

Figure 1:
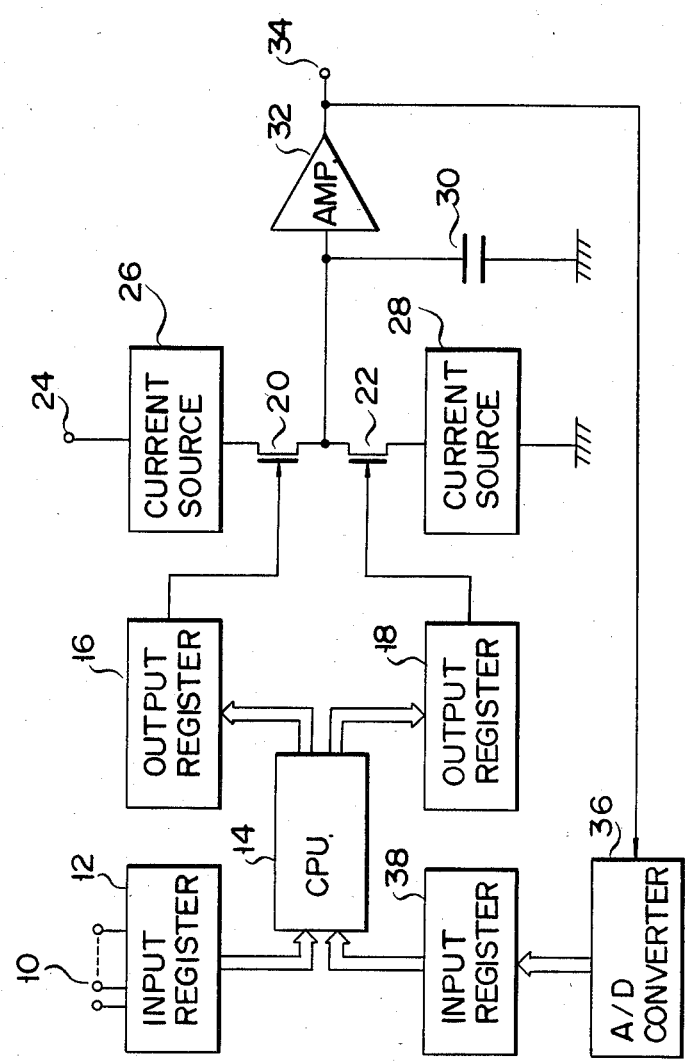
FIG. 1 is a block circuit diagram of a first embodiment of a digital to analog converting apparatus according to the invention.

FIG. 1 shows a first embodiment of this invention. An input terminal 10 is connected to an input register 12. An output signal of the input register 12 is supplied to a central processing unit 14 (hereinafter called "CPU 14"). An output signal of the CPU 14 is coupled to two output registers 16 and 18. An output signal of the output register 16 is coupled to the gate of an N channel MOS FET 20, and an output signal of the output register 18 to the gate of an N channel MOS FET 22. Both MOS FETs 20 and 22 function as analog switches. A power source terminal 24 of positive polarity is grounded via a current source 26, MOS FETs 20 and 22 and another current source 28. The current sources 26 and 28 are each constituted by, for example, a resistor. The current source 26 supplies current to the MOS FET 20, and the current source 28 receives current from the MOS FET 22. The node at which the MOS FETs 20 and 22 are connected is grounded via a capacitor 30 and is connected to a voltage follower amplifier 32 having a high input impedance. The output terminal of the amplifier 32 is connected to an output terminal 34 and also to an A/D converter 36. An output signal of the A/D converter 36 is supplied to an output register 38, an output signal of which is supplied to the CPU 14.

Figure 2:
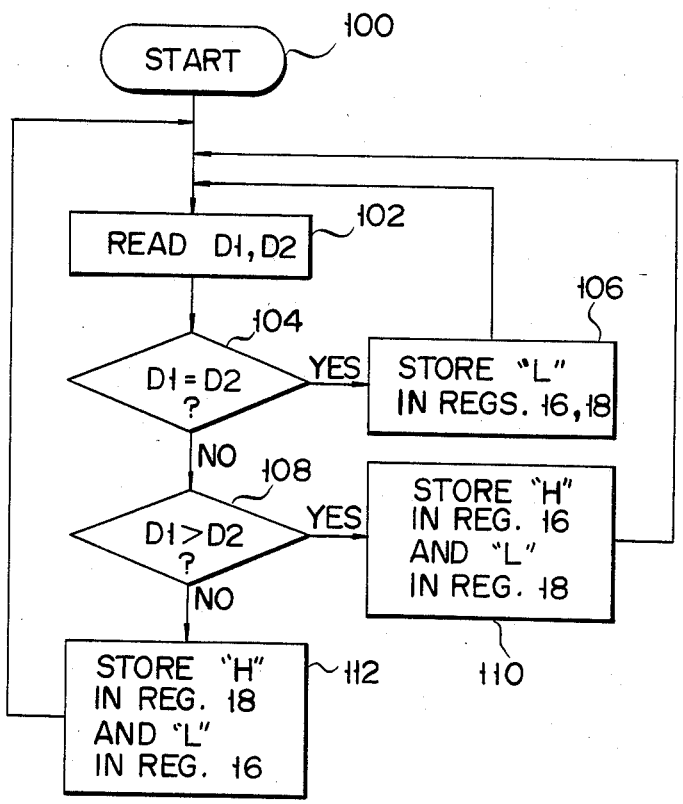
FIG. 2 is a flow chart illustrating operation of the apparatus of FIG. 1.

Now referring to the flow chart of FIG. 2, operation of the embodiment of FIG. 1 will be described.

Assume that a digital value D1 has been stored into the input register 12 through the input terminal 10 and that the capacitor 30 is charged to a certain voltage. Then, the A/D converter 36 supplies the input register 38 with a digital voltage D2 which corresponds to the output of the amplifier 32, i.e. the output voltage of the capacitor 30 amplified.

In step 100, the CPU 14 commences a sampling cycle. In step 102 it reads the data D1 and D2 from the input registers 12 and 38, respectively. In step 104 it determines if D1 and D2 are equal. If D1 and D2, i.e. the digital input value and analog output value, are found equal, the CPU 14 proceeds to step 106, wherein an L signal is stored in both the output registers 16 and 18. If D1 and D2 are not found equal, the CPU 14 determines in step 108 whether D1 is greater than D2 or not. As long as the L signal is stored in both the output registers 16 and 18, the MOS FETs 20 and 22 remain non-conductive and the output voltage of capacitor 30 remains unchanged.

If D1 is greater than D2 in step 108, that is, if the digital input value supplied to the input register 12 is greater than the analog output value supplied to the output terminal 34, the CPU 14 proceeds to step 110. In step 110 an H signal is stored in the output register 16, and an L signal in the output register 18. In this case, the MOS FET 20 becomes conductive, and the MOS FET 22 becomes non-conductive. As a result, an output current flows from the current source 26 via the MOS FET 20 and the capacitor 30 is therefore charged. The output voltage of the capacitor 30 then rises and is supplied to the A/D converter 36. Consequently, D2 increases, and the analog output value approaches the digital input value.

If D1 is less than D2 in the step 108, H and L signals are stored in step 112 respectively in the output registers 18 and 16. In this case, the MOS FET 20 becomes non-conductive, and the MOS FET 22 becomes conductive. As a result, the capacitor 30 is discharged and current flows via the MOS FET 22 to the current source 28. Consequently, the output voltage of the capacitor 30 decreases and D2 becomes smaller and thus approaches D1.

After steps 106, 110 and 112 are executed, the CPU 14 proceeds again to the step 102 and reads data D1 and D2 from the input registers 12 and 38, respectively. Thereafter, steps 104, 106, 108, 110 and 112 are repeated once or more times until the analog value supplied to the output terminal 34 becomes equal to the digital input value supplied to the input terminal 10.

Figure 3:
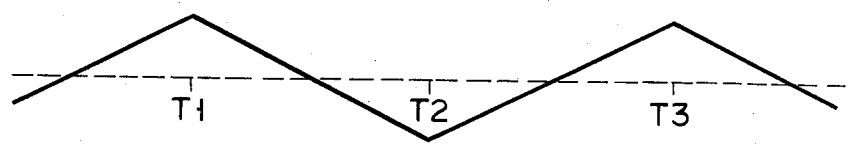
FIG. 3 shows an output voltage waveform.

The A/D converter 36 converts the analog output value to a digital value during every sampling period. The output voltage of the A/D converter 36 may therefore fluctuate from the true value as illustrated in FIG. 3, wherein the broken line is the true value and T1, T2 and T3 are sampling times. This does not matter since the fluctuation would be 10 mA at most in the case when the current sources 26 and 28 supply 0.1 mA, the capacitor 30 has a capacitance of 50 μF and the sampling cycle is 5 ms.

As mentioned above, the apparatus of FIG. 1 uses a capacitor instead of a resistor ladder circuit. The invention therefore provides a digital to analog converting apparatus which is small, simple and inexpensive. The CPU 14 may be used not only to achieve analog to digital conversion but also to perform other operations. If the CPU 14 is used in this way, interruption will only be effected when it is desired to carry out an analog to digital conversion, at which time the operations shown in FIG. 2 will be carried out. Once the CPU 14 has stored signals in the output registers 16 and 18, it next interruption. Other devices than the CPU 14 may be used to compare the digital input with the analog output. For example, a discrete comparator or a logic circuit may be used for that purpose. Further, the CPU 14, A/D converter 36 and registers 12 and 38 may be replaced by a microcomputer. Still further, instead of the MOS FETs, bipolar transistors, relay switches, etc. may be used for the analog switches.

Figure 4:
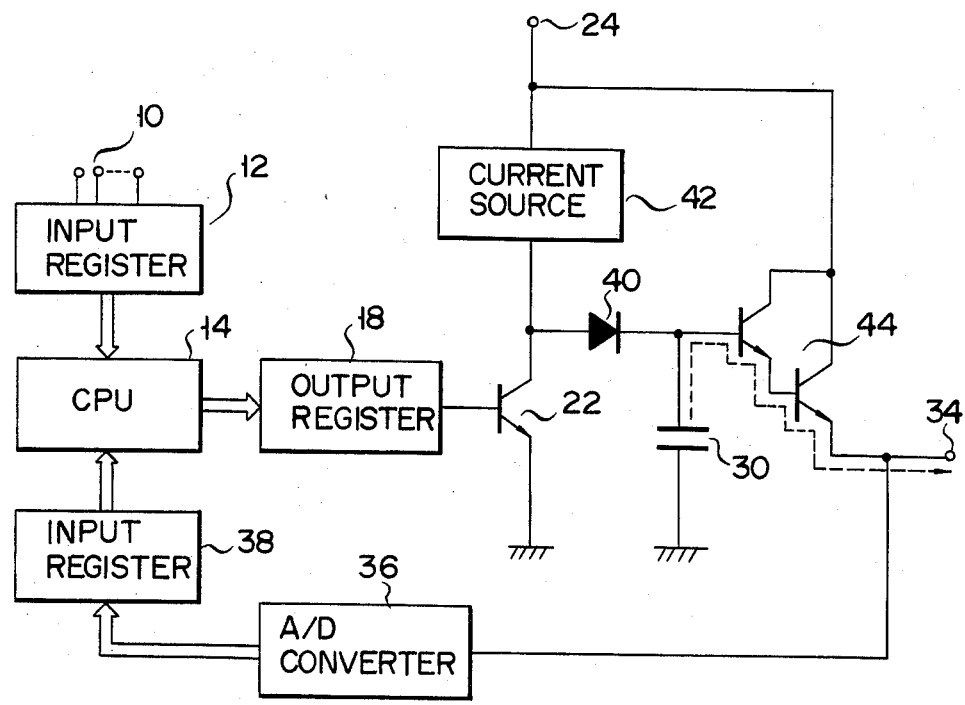
FIG. 4 is a block circuit diagram of a second embodiment of a digital to analog converting apparatus according to the invention.

FIG. 4 shows a second embodiment of this invention. In FIG. 4, same numerals are used to denote the same elements as shown in FIG. 1. This embodiment is identical with the embodiment of FIG. 1, except that it is not provided with the output register 16 and the analog switch 20. As shown in FIG. 4, the output terminal of the output register 18 is connected to the base of an NPN transistor 22. The transistor 22 functions as an analog switch, with its emitter grounded and its collector connected to the anode of a diode 40. A power source terminal 24 is connected to an input terminal of a current source 42 which supplies current to the transistor 22. The cathode of the diode 40 is grounded via a capacitor 30 and connected to the connecting apparatus output terminal 34 via a Darlington pair of transistors 44. The output terminal of the Darlington pair of transistors 44 is also connected to the A/D converter 36.

Figure 5:
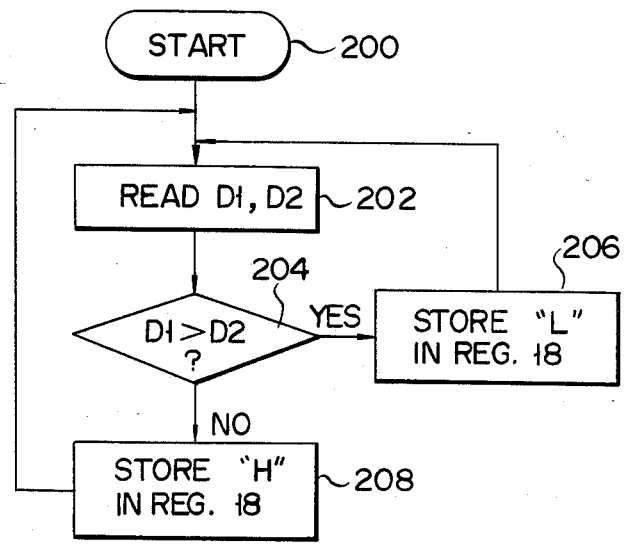
FIG. 5 is a flow chart illustrating operation of the apparatus of FIG. 4.

Now, referring to the flow chart of FIG. 5, operation of the embodiment of FIG. 4 will be described, the input registers 12 and 38 having received data D1 and D2, respectively.

In step 202 the CPU 14 reads D1 and D2 respectively from the input registers 12 and 38. In step 204 it is determined if D1 is greater than D2. If D1 is greater than D2, that is, if the digital input value is greater than the analog output value, the CPU 14 proceeds to step 206, wherein an L signal is stored in the output register 18. In this case, the transistor 22 is non-conductive. As a result, the output current of the current source 42 flows into the capacitor 30 via the diode 40, thus raising the output voltage of the capacitor 30. Consequently, the analog output value approaches the digital input value.

If D1 is less than D2, that is, if the digital input value is smaller than the analog output value, an H signal is stored in the output register 18 in step 208. In this case, the transistor 22 become conductive. The output current of the current source 42 flows to ground via the transistor 22. The capacitor 30 is therefore not charged. As a result, a discharge current path is formed, which extends from the capacitor 30 to the output terminal 34 via the Darlington pair of transistors 44 as indicated by a broken line in FIG. 4. The capacitor 30 is thus discharged, whereby the output voltage of the capacitor 30 gradually decreases. Consequently, the analog output value approaches the digital input value.

Steps 202, 204 and 206 are repeated in sequence, one or more times, until the analog output value increases to be equal to the digital input value. Similarly, steps 202, 204 and 208 are repeated in sequence, one or more times, until the analog output value decreases to be equal to the digital input value. Thus, an analog voltage corresponding to the digital input value will be obtained at the output terminal 34.

The embodiment of FIG. 4 uses a Darlington pair of transistors in place of the current source of the embodiment of FIG. 1 to discharge the capacitor 30. The leakage current of the Darlington pair of transistors is used to discharge the capacitor 30. This technique renders the apparatus of FIG. 4 simpler than that of FIG. 1.

What is claimed is:

1. A digital to analog converting apparatus connectable to a power source, comprising:
    comparison means having first and second input terminals for generating a comparison signal having a first value when the polarity of the difference between two input signals supplied to the first and second input terminals is positive and a second value when the polarity of said difference is negative, said first input terminal being adapted to receive a digital input signal;
    capacitor means;
    a source of charging current for said capacitor means;
    a switching element coupled to said comparison means and said source, said switching element being rendered conductive when said comparison signal has one of said first and second values and non-conductive when said comparison signal has the other of said first and second values;
    a diode having one end connected at the node where said source and said switching element are connected;
    a Darlington pair of transistors having a first electrode, a second electrode, and a third electrode, the first electrode being coupled to the other end of said diode, said capacitor means having one end connected at the node where said diode and the first electrode of the Darlington pair of transistors are coupled, said capacitor means being charged by said source when said switching element is rendered conductive, and said capacitor means being discharged by the Darlington pair of transistors when said switching element is rendered non-conductive, the second electrode of the Darlington pair of transistors being coupled to the power source; and analog to digital converting means coupled between the third electrode of the Darlington pair of transistors and the second input terminal of said comparison means for supplying to said second input terminal a digital signal, the value of which corresponds to the voltage of said capacitor means;

the digital to analog converting apparatus having an analog output coupled to the third electrode of the Darlington pair of transistors and a digital input coupled to said first input terminal of said comparison means.

2. A digital to analog converting apparatus connectable to a power source, comprising:

comparison means having first and second input terminals for generating a comparison signal having a first value when the polarity of the difference between two input signals supplied to the first and second input terminals is positive, a second value when the polarity of said difference is negative, and a third value when the two input signals are equal, said first input terminal being adapted to receive a digital input signal;

capacitor means;

a source of charging current for said capacitor means;

a source for discharging current from said capacitor means;

a first switching element connected between said charging source and said capacitor means which is rendered conductive when the comparison signal has said first value; and a second switching element connected between said discharging source and said capacitor means which is rendered conductive when the comparison signal has said second value, said first and second switching elements being rendered non-conductive when said comparison signal has said third value;

analog to digital converting means coupled between said capacitor means and the second input terminal of said comparison means for supplying to said second input terminal a digital signal, the value of which corresponds to the voltage of said capacitor means;

the digital to analog converting apparatus having an analog output coupled to the capacitor means and a digital input coupled to said first input terminal of said comparison means.

* * * * *

UNITED STATES PATENT AND TRADEMARK OFFICE
CERTIFICATE OF CORRECTION

PATENT NO. : 4,547,762

DATED : Oct. 15, 1985

INVENTOR(S) : Masahiko Ono

It is certified that error appears in the above-identified patent and that said Letters Patent is hereby corrected as shown below:

column 1, line 54, "operation circuit" should read --comparison means--.

column 2, line 30, "output" should read --input--.

column 3, line 37, "it next" should read --it awaits the next--.

column 3, line 47, "FIG. 4, same" should read --FIG. 4, the same--.

column 3, line 59, "connecting" should read --converting--.

Signed and Sealed this

Seventeenth Day of June 1986

[SEAL]

Attest:

DONALD J. QUIGG

*Attesting Officer*  *Commissioner of Patents and Trademarks*